(12) United States Patent
Nair

(10) Patent No.: US 11,933,838 B2
(45) Date of Patent: Mar. 19, 2024

(54) MANAGING HEALTH CONDITION OF A ROTATING SYSTEM

(71) Applicant: Siemens Aktiengesellschaft, Munich (DE)

(72) Inventor: P. V. Sudev Nair, Bangalore (IN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/571,898

(22) Filed: Jan. 10, 2022

(65) Prior Publication Data

US 2022/0128620 A1 Apr. 28, 2022

Related U.S. Application Data

(63) Continuation of application No. PCT/EP2020/069547, filed on Jul. 10, 2020.

(30) Foreign Application Priority Data

Jul. 12, 2019 (EP) .................................... 19186078

(51) Int. Cl.
*G01R 31/28* (2006.01)
*F04B 51/00* (2006.01)
(Continued)

(52) U.S. Cl.
CPC .......... *G01R 31/2846* (2013.01); *F04B 51/00* (2013.01); *F04D 15/0088* (2013.01);
(Continued)

(58) Field of Classification Search
CPC ............ G05B 23/0254; G05B 23/0281; G05B 23/0283; G01R 31/343; G01R 31/2846;
(Continued)

(56) References Cited

U.S. PATENT DOCUMENTS

| | | |
|---|---|---|
| 2006/0071666 A1 | 4/2006 | Unsworth et al. |
| 2013/0024416 A1 | 1/2013 | Herzog |
| 2019/0287005 A1 | 9/2019 | Wicks et al. |

FOREIGN PATENT DOCUMENTS

| | | | | |
|---|---|---|---|---|
| CN | 108027358 B | * | 12/2021 | ............. F03D 17/00 |
| EP | 2975525 A1 | | 1/2016 | |

(Continued)

OTHER PUBLICATIONS

International Search Report and the Written Opinion for International Patent Application PCT/EP2020/069547 dated Sep. 21, 2020.

*Primary Examiner* — John H Le
(74) *Attorney, Agent, or Firm* — Lempia Summerfield Katz LLC

(57) ABSTRACT

The present disclosure relates to a system, an apparatus, and a method for managing health condition of at least one rotating system. The method includes receiving, by a processing unit, operational data associated with the rotating system in real-time, from one or more sensing units. The operational data includes parameter values corresponding to an operation of the rotating system. Further, a virtual replica of the rotating system is configured using the operational data. A behavior of the rotating system is simulated on a simulation instance of the rotating system based on the configured virtual replica. The simulation results are analyzed to determine an abnormality in the health condition of the rotating system. The abnormality corresponds to a health status of an internal component of the rotating system. Further, a notification indicating the abnormality is generated, on a Graphical User Interface.

13 Claims, 6 Drawing Sheets

(51) Int. Cl.
*F04D 15/00* (2006.01)
*G01R 31/34* (2020.01)
*G05B 23/02* (2006.01)

(52) U.S. Cl.
CPC ........ *G01R 31/343* (2013.01); *F04D 15/0077* (2013.01); *G05B 23/0283* (2013.01)

(58) Field of Classification Search
CPC ... F04B 51/00; F04D 15/0077; F04D 15/0088
USPC .......................................................... 702/30
See application file for complete search history.

(56) References Cited

FOREIGN PATENT DOCUMENTS

| EP | 3255512 A2 | 12/2017 | |
|---|---|---|---|
| WO | WO-2013129989 A1 * | 9/2013 | ............ G01M 13/00 |
| WO | 2015149928 A2 | 10/2015 | |
| WO | 2019182894 A1 | 9/2019 | |

* cited by examiner

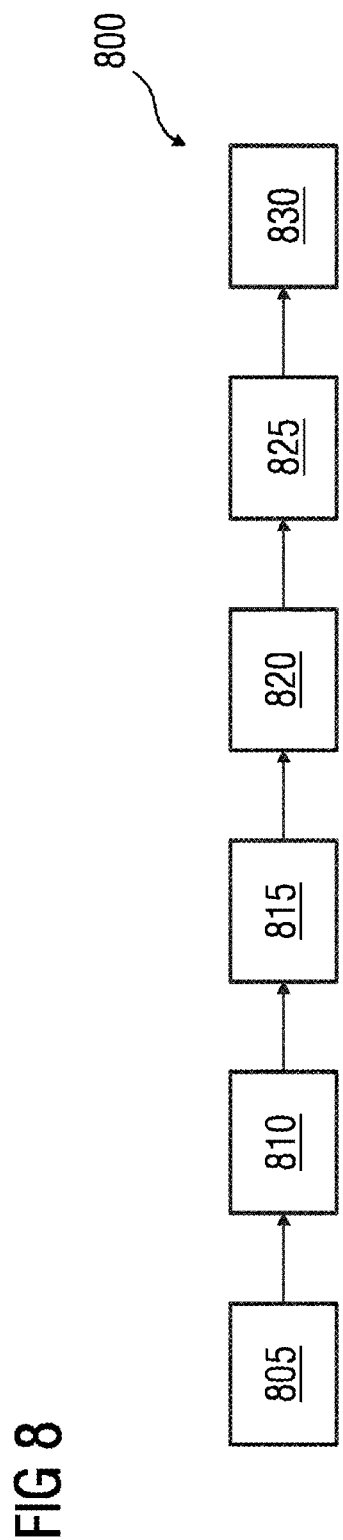

MANAGING HEALTH CONDITION OF A ROTATING SYSTEM

The present patent document is a continuation of PCT Application Serial No. PCT/EP2020/069547, filed Jul. 10, 2020, designating the United States, which is hereby incorporated by reference, and this patent document also claims the benefit of European Patent Application No. 19186078.2, filed Jul. 12, 2019, which is also hereby incorporated by reference.

TECHNICAL FIELD

The present disclosure relates to a field of rotating systems, and more particularly relates to managing health condition of rotating systems.

BACKGROUND

Rotating systems such as generators and motors are used in various applications. With usage, a rotating system may develop numerous problems which manifest as abnormalities in the health condition of the rotating system. Abnormalities related to external components of the rotating system may be easily detected and resolved. However, abnormalities related to internal components of the rotating system may be hard to detect as they are internal to the rotating system. Eventually, the undetected abnormalities may lead to a breakdown of the rotating system. The breakdown of the rotating system may further cause damage to equipment that are operatively coupled to the rotating system and may also jeopardize human lives. When the rotating system is part of a larger setup, the breakdown of the rotating system may lead to a downtime of the setup and also productivity losses. Currently known techniques do not support determination of abnormalities associated with the internal components of the rotating system prior to the breakdown of the rotating system.

WO 2015/149928 discloses a method for online evaluation of operative range and performance of a compressor. The method includes at least the following offline steps: setting up a digital undegraded model of the compressor in an undegraded state of the compressor; calibrating and validating the undegraded model using historical data from a compressor running line; calculating at least one undegraded performance map using the undegraded model; and at least the following online steps: calculating a degradation-adaptive model by updating the undegraded model with operative data of the compressor determined by at least one sensor of the compressor; calculating at least one actual performance map of an operative state of the compressor using the degradation-adaptive model; detecting malfunctions of the compressor by comparing the at least one undegraded performance map derived by the undegraded model and the at least one actual performance map derived by the degradation-adaptive model via at least one mathematical function. However, the patent application does not address the problem of determining specific abnormalities related to internal components of a rotating system, where sensors cannot be positioned.

EP 3255512 A2 discloses an adaptive model-based method to quantify degradation of a power generation system. According to EP 3255512 A2, differences between an estimated parameter value and a measured parameter value are reduced based on a correction factor. The correction factor is further used to generate a transfer function relating estimated and measured values of a second parameter. However, the transfer function fails to correlate between the estimated parameter value and a specific abnormality associated with internal components of the power generation system.

EP 2975525 A1 discloses a system analysis device and a system analysis method, for generating a correlation diagram. However, the application fails to disclose how such a correlation diagram may be applied for determining specific abnormalities associated with internal components of a rotating system.

US 2013/0024416 A1 discloses a method for determining the future operational condition of an object. The method includes obtaining reference data that indicates the normal operational state of the object and obtaining input pattern arrays. Each input pattern array has a plurality of input vectors, while each input vector represents a time point and has input values representing a plurality of parameters indicating the current condition of the object. However, the patent application does not address the problem of determining abnormalities with respect to internal components of a rotating system based such reference data and input array.

US 2019/0287005 A1 discloses a method including receiving operational data associated with an operating condition of a pump and determining prognostic data using the received operational data using a first predictive model. The prognostic data including a plurality of metrics associated with the pump and predicted in relation to the operational data. The operating condition pertain to a motor failure, a pump failure, a cable or motor lead extension failure, a seal failure, a shaft and/or coupling failure and the like. However, the patent application does not discuss about how abnormalities associated with internal components of a rotating system are determined.

In light of the above, there exists a need for a method and a system to manage a health condition of the rotating system. More specifically, there is a need to determine abnormalities due to health condition of specific internal components of the rotating system in real-time.

SUMMARY AND DESCRIPTION

Therefore, it is an object of the present disclosure to provide a system, an apparatus, and a method for managing health condition of a rotating system based on determination of abnormalities in the rotating system.

The scope of the present disclosure is defined solely by the appended claims and is not affected to any degree by the statements within this summary. The present embodiments may obviate one or more of the drawbacks or limitations in the related art.

The object of the present disclosure is achieved by a method for managing the health condition of a rotating system, as disclosed herein. The term 'rotating system,' as used herein, may refer to any electrical machine, operating on the principle of electromagnetic induction, including a rotor and a stator separated by an airgap. Non-limiting examples of the rotating systems include AC generators (alternators), DC generators, AC motors, DC motors, amplidynes, synchros, metadynes, Eddy current clutches, Eddy current brakes, Eddy dynamometers, hysteresis dynamometers, and rotary converters.

The method for managing health condition of the rotating system includes receiving, by a processor or processing unit, operational data associated with the rotating system, in real-time, from one or more sensing units. The operational data includes parameter values corresponding to an operation of the rotating system. Non-limiting examples of the parameter values may include vibration frequency, vibration amplitude, magnetic field strength, magnetic flux density, noise amplitude, noise frequency, current, voltage, temperature, and so on.

The method further includes configuring a virtual replica of the rotating system using the operational data. The virtual replica is a virtual representation of the rotating system. In one embodiment, the virtual replica may be based on one or more models of the rotating system. Non-limiting examples of the one or more models include CAD models, one-dimensional (1D) models, two-dimensional (2D) models, three-dimensional (3D) models, metamodels, stochastic models, parametric models, machine learning models, Artificial Intelligence (AI) based models, neural network models, deep learning models, and so on. The virtual replica of the rotating system is configured using the operational data by updating the virtual replica based on the operational data, using the simulation instance in real-time. In one embodiment, the virtual replica may be created and stored in an apparatus based on information received from an Original Equipment Manufacturer (OEM) of the rotating system. In another embodiment, the virtual replica may be stored in a user device, a personal computer, a removable storage device, a server, a cloud storage, and so on. Further, the stored virtual replica may be accessed and downloaded onto the apparatus.

Advantageously, the virtual replica facilitates a soft sensor technique for determining abnormalities in the rotating system. More specifically, the virtual replica determines abnormalities associated with the internal components of the rotating system in real-time, based on the operational data.

The method further includes generating simulation results by simulating behavior of the rotating system on at least one simulation instance of the rotating system based on the configured virtual replica of the rotating system. The simulation results are indicative of the behavior of the rotating system. More specifically, the simulation results are generated by executing the virtual replica on a simulation platform for the at least one simulation instance.

Advantageously, the virtual replica is executed using operational data received in real-time. The generated simulation results correspond to a real-time behavior of the rotating system. Further, the simulation speed may be maximized by employing a model of the rotating system.

The method further includes determining abnormality in a health condition of the rotating system based on analysis of the simulation results. The abnormality in the health condition corresponds to a health status of at least one internal component of the rotating system. The term 'abnormality,' as used herein, refers to data associated with an abnormal condition. The abnormal condition may include, but is not limited to, airgap asymmetry, rotor vibrations, rotor displacement, magnetic field asymmetry, eccentricity of the airgap, unbalanced forces, heating, bearing defects, rotor bar breakage, stator related problems, and so on. Non-limiting examples of the internal component include, rotor, stator, bearings, stator coils, brushes, and so on. In one embodiment, the method further includes determining a deviation in the behavior of the rotating system by analyzing the simulation results with respect to an expected behavior of the rotating system. Further, at least one correlation model is identified based on the deviation in the behavior of the rotating system. Further, the correlation model and one or more parameter values indicative of the deviation in the behavior of the rotating system are used to determine the abnormality in the health condition of the rotating system.

The method further includes generating a notification indicating that the health condition of the rotating system is abnormal on a Graphical User Interface. In one embodiment, a representative view of the abnormality may be rendered on the Graphical User Interface. The representative view of the abnormality includes a real-time representation of the health condition of the internal component associated with the abnormality. In a further embodiment, the real-time representation of the internal component associated with the abnormality is a color-coded representation of the internal component in conjunction with the abnormality in the health condition of the rotating system. In addition to the representative view, an audio alert may also be generated to indicate the presence of the abnormality.

Advantageously, the present disclosure facilitates notifying maintenance personnel about specific abnormalities related to internal components associated with the rotating system in real-time. This enables the maintenance personnel to perform timely maintenance with less downtime of the rotating system.

In one embodiment, the method further includes determining a root cause associated with the determined abnormality in the health condition of the rotating system and predicting one or more preventive maintenance actions to address the root cause associated with the determined abnormality in the health condition of the rotating system.

Advantageously, the present disclosure enables determination of the abnormality in the health condition of the rotating system and the root cause of the abnormality without dismantling the rotating system.

In one embodiment, the method further includes predicting an impact of the abnormality in the rotating system on the performance of a facility, wherein the rotating system is a part of the facility. In one example, the impact may be associated with a quality of operation of the facility. In another example, the impact may be associated with possible damages to systems operatively coupled to the rotating system.

In one embodiment, the method further includes determining a remaining useful life of the internal component of the rotating system based on the abnormality in the health condition of the rotating system. In a further embodiment, the method further includes predicting a remaining life of the rotating system, based on the remaining useful life of the internal component of the rotating system.

Advantageously, the present disclosure facilitates determination of the remaining useful life of the rotating system without manual testing of the rotating system. Consequently, the disclosed method provides more accurate results compared to manual testing methods. Further, the disclosed method is also faster compared to manual testing methods.

In one embodiment, the method further includes optimizing a downtime of the facility by scheduling a preventive maintenance activity based on the impact of the abnormality in the health condition of the rotating system on the performance of the facility.

Advantageously, the present disclosure facilitates automatic scheduling of the preventive maintenance activity without requiring any manual inputs. Further, human operators may plan other activities based on the scheduled preventive maintenance activity. Furthermore, the optimization of downtime helps in increasing productivity of the facility.

The object of the present disclosure is achieved by an apparatus for managing health condition of a rotating system is disclosed. The apparatus includes one or more processing units and a memory unit communicatively coupled to the one or more processing units. The memory unit includes a health monitoring module stored in the form of machine-readable instructions executable by the one or more processing units. The health monitoring module is configured to perform method acts described above. The execution of the health monitoring module may also be performed using co-processors such as Graphical Processing Unit (GPU), Field Programmable Gate Array (FPGA), or Neural Processing/Compute Engines.

According to an embodiment, the apparatus may be an edge computing device. As used herein "edge computing" refers to computing environment that is capable of being performed on an edge device (e.g., connected to the sensing units in an industrial setup and one end and to a remote server(s) such as for computing server(s) or cloud computing server(s) on other end), which may be a compact computing device that has a small form factor and resource constraints in terms of computing power. The apparatus may also be implemented using a network of the edge computing devices. The network of edge computing devices may be referred to as a fog network.

In another embodiment, the apparatus is a cloud computing system having a cloud computing-based platform configured to provide a cloud service for analyzing operational data. As used herein, "cloud computing" refers to a processing environment including configurable computing physical and logical resources, for example, networks, servers, storage, applications, services, etc., and data distributed over the network, for example, the internet. The cloud computing system provides on-demand network access to a shared pool of the configurable computing physical and logical resources. The network may be a wired network, a wireless network, a communication network, or a network formed from any combination of these networks.

Additionally, the object of the present disclosure is achieved by a system including one or more sensing units configured to provide operational data associated with a rotating system. The system further includes an apparatus, as described above, communicatively coupled to the one or more sensing units. The apparatus is configured to manage health condition of the rotating system based on the operational data.

The object of the present disclosure is achieved by a computer-program product having machine-readable instructions stored therein, which when executed by a processor, cause the processor to perform a method as describe above.

The above-mentioned attributes, features, and advantages of this disclosure and the manner of achieving them, become more apparent and understandable with the following description of embodiments in conjunction with the corresponding drawings. The illustrated embodiments are intended to illustrate, but not limit the disclosure.

The present disclosure has been explained in detail below, by taking a squirrel cage induction motor, henceforth referred to as 'motor', as an example of a rotating system.

BRIEF DESCRIPTION OF THE DRAWINGS

The present disclosure is further described hereinafter with reference to illustrated embodiments shown in the accompanying drawings, in which:

FIG. 8 illustrates a flowchart of a method for managing health condition of a motor, in accordance with one embodiment.

DETAILED DESCRIPTION

Figure 1:
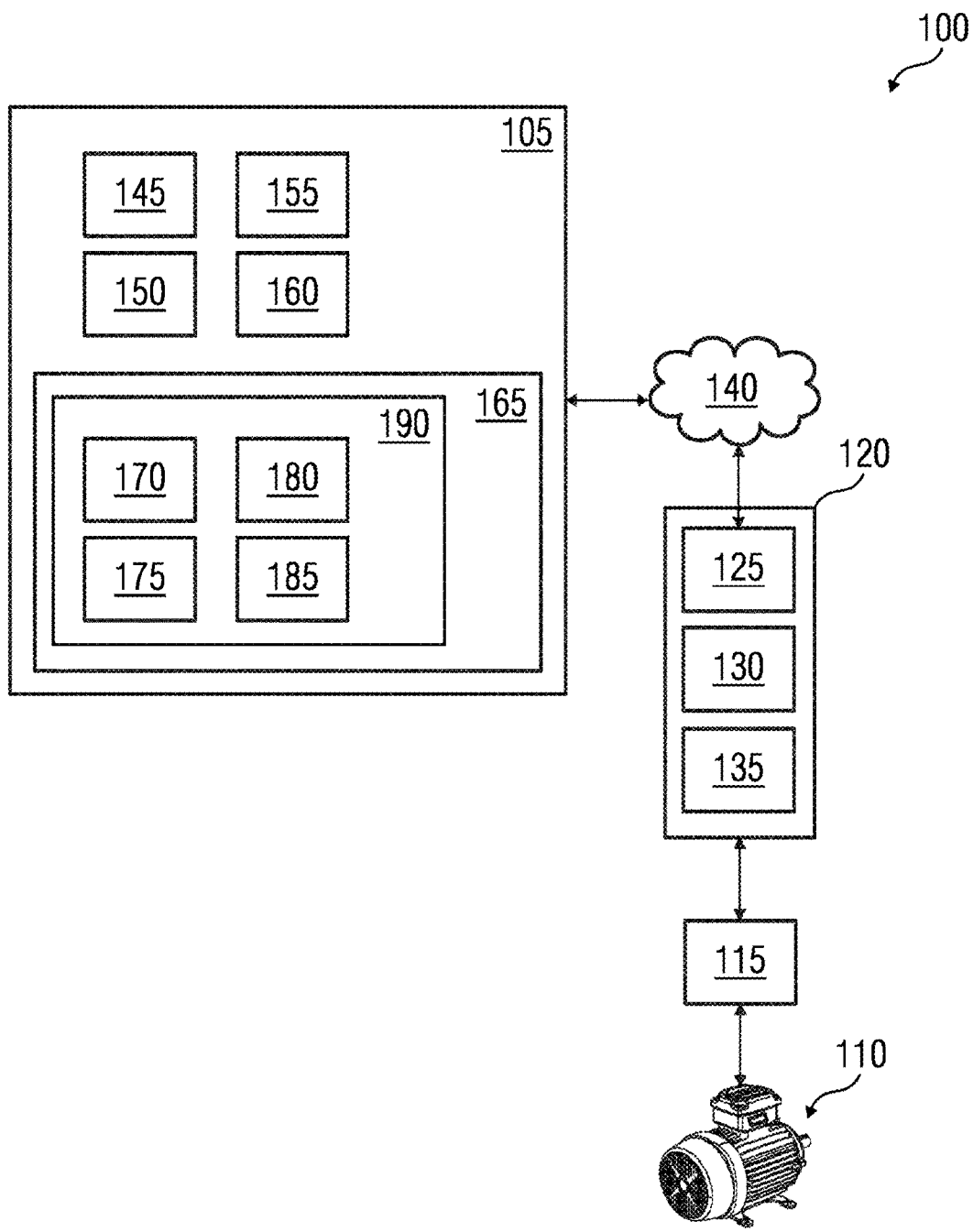
FIG. 1 illustrates an environment of an apparatus for managing health condition of a motor, in accordance with one embodiment.

Hereinafter, embodiments for carrying out the present disclosure are described in detail. The various embodiments are described with reference to the drawings, wherein like reference numerals are used to refer to like elements throughout. In the following description, for purpose of explanation, numerous specific details are set forth in order to provide a thorough understanding of one or more embodiments. It may be evident that such embodiments may be practiced without these specific details.

Referring to FIG. 1, an environment 100 of an apparatus 105 for managing health condition of a motor 110 is illustrated, in accordance with one embodiment. In one example, the environment may be a facility, wherein the motor or apparatus is a part of the facility. In the present embodiment, the motor 110 is a squirrel cage induction motor.

The motor 110 is associated with one or more sensing units 115. The one or more sensing units 115 may include sensors operatively coupled to the motor 110 for measuring parameter values corresponding to an operation of the motor 110 in real-time. In one example, the one or more sensing units 115 may measure values associated with vibrations at different parts of the motor 110 such as housing, shaft, bearings and so on. In another example, the one or more sensing units 115 may measure values of stray magnetic flux generated by the motor 110. The one or more sensing units 115 are further communicatively coupled to a controller 120.

The controller 120 includes a trans-receiver 125, one or more first processing units 130, and a first memory 135. The trans-receiver 125 is configured to connect the controller 120 to a network interface 140. In one embodiment, the controller 120 receives operational data from the one or more sensing units 115 and transmits the operational data to the apparatus 105 through the network interface 140.

The apparatus 105 includes a communication unit 145, one or more second processing units 150, a display 155, a Graphical User Interface (GUI) 160, and a second memory 165 communicatively coupled to each other. In an embodiment, the communication unit 145 includes a transmitter (not shown), a receiver (not shown), and Gigabit Ethernet port (not shown). The second memory 165 may include 2 Giga byte Random Access Memory (RAM) Package on Package (PoP) stacked and Flash Storage. The one or more second processing units 150 are configured to execute the defined computer program instructions in the modules. Further, the one or more second processing units 150 are also configured to execute the instructions in the second memory 165 simultaneously. The display 155 includes a High-Definition Multimedia Interface (HDMI) display and a cooling fan (not shown). Additionally, control personnel may access the apparatus 105 through the GUI 160. The GUI 160 may include a web-based interface, a web-based downloadable application interface, and so on.

In one embodiment, the apparatus 105 is configured on a cloud computing platform (not shown). The cloud computing platform may be implemented as a service for analyzing data.

The second memory 165 includes a plurality of modules: a calibration module 170, a correlation module 175, a simulation module 180, and a diagnostics module 185, (henceforth collectively referred as a health monitoring module 190). The following description explains functions of the modules when executed by the one or more second processing units 150.

The calibration module 170 calibrates a virtual replica of the motor 110 to replicate substantially similar responses of the motor 110 in real-time, upon simulation. The virtual replica may be based on metadata associated with the motor 110, historical data associated with the motor 110, and a model of the motor 110. The metadata may include a current rating of the motor 110, a housing material of the motor 110, magnetic hysteresis coefficients of different parts of the motor 110, thermal coefficients of different parts of the motor 110, and so on. The historical data may include historic information related to performance, maintenance, and health condition of the motor 110. The model of the motor 110 may include physics-based models such as a magnetic flux model, a vibration model, or a combination thereof.

In particular, the calibration module 170 calibrates the virtual replica by updating the model to accurately represent the motor 110. In other words, the virtual replica is calibrated to provide a certain degree of fidelity with the motor 110. The calibration of the virtual replica involves tuning of parameters associated with the model to accurately represent the response of the motor 110 for a given operating condition, (e.g., load). In one embodiment, the virtual replica is calibrated using machine learning techniques including but not limited to, supervised learning techniques, unsupervised learning techniques, and reinforcement learning techniques. The machine learning techniques may use stochastic simulations based on the virtual replica and the operational data obtained from the motor 110 for calibrating the virtual replica. In one example, the virtual replica may be calibrated using Bayesian calibration technique. Upon calibrating, a response of the virtual replica, say at time t=10 seconds, may represent the response of the motor 110 at time t=10 seconds under the same operating conditions. The operating conditions may be defined by a simulation instance. In another embodiment, the virtual replica is calibrated using Artificial Intelligence (AI) based techniques. In one example, the AI based technique may involve deep learning. The process of calibrating the virtual replica is explained in detail, using an example, with reference to FIG. 2.

The correlation module 175 is configured to determine one or more correlations between parameter values associated with the motor 110 and one or more abnormalities in the motor 110. In one example, the one or more correlations are predetermined by the correlation module 175 using a correlation analysis technique. The correlation analysis technique may involve machine learning techniques, non-linear regression techniques, linear regression techniques, and so on. The one or more correlations determined are further used to generate a correlation model. An exemplary method for determining a correlation between housing vibrations and rotor displacement (i.e., displacement of the rotor) has been explained with reference to FIGS. 3, 4, 5, and 6.

The simulation module 180 is configured to provide a simulation platform for the virtual replica. The simulation platform enables the virtual replica to simulate the real-time behavior of the motor 110 based on the operational data received in real-time. In the present embodiment, the operational data obtained from the one or more sensing units 115 is used to simulate a behavior of the motor 110 using the virtual replica. In order to simulate the behavior of the motor 110, at first, the virtual replica is configured based on the operational data. More specifically, the virtual replica is updated using the operational data, based on a simulation instance associated with the motor 110. The simulation instance may define operational or environmental conditions that may affect the behavior of the motor 110. After updating, the virtual replica may simulate the behavior of the motor 110 in real-time, upon being executed on the simulation platform. Therefore, in an embodiment, the operational data is fed to the meta model of the motor 110 in the virtual replica during the simulation. Upon simulation, the simulation module 180 generates simulation results.

The diagnostics module 185 is configured to analyze the simulation results generated by the simulation module 180. More specifically, the simulation results are analyzed to determine a deviation in the behavior of the motor 110 with respect to an expected behavior of the motor 110. For example, the deviation in the behavior of the motor 110 may be associated with rotor displacement in the motor 110. The expected behavior of the motor 110 may be determined based on predefined conditions stored in the second memory 165. For example, the predefined condition may include a rotor displacement less than an upper threshold value of 0.05 mm. If the actual value of rotor displacement in the motor 110 is 0.08 mm, then the deviation may be 0.03 mm. Based on the deviation in the behavior of the motor 110, one or more correlation models are identified from among the correlation models generated by the correlation module 175. Further, the diagnostics module 185 determines the abnormality in the motor 110 using the one or more correlation models identified. For example, the abnormality may be one of parallel misalignment of the rotor, angular misalignment of the rotor, airgap asymmetry, and so on.

Upon determining the abnormality, the diagnostics module 185 may determine a root cause associated with the determined abnormality in the health condition of the rotating system. For example, the root cause associated with angular misalignment of the rotor may be due to deformation of the motor 110 due to improper coupling with a driven system. Upon determining the root cause, the diagnostics module 185 may predict one or more preventive maintenance actions to address the root cause associated with the determined abnormality in the health condition of the motor 110.

The diagnostics module 185 may further predict an impact of the abnormality in the health condition of the motor 110 on the performance of the facility. For example, the abnormality in the health condition of the motor 110 may affect a system driven by the motor 110, which may ultimately lead to a failure of the driven system. The diagnostics module 185 may further optimize a downtime of the facility by scheduling a preventive maintenance activity based on the impact of the abnormality in the health condition of the rotating system on the performance of the facility.

The diagnostics module 185 may further determine a remaining useful life of the internal component corresponding to the abnormality in the health condition of the motor 110. For example, in case of angular misalignment of the rotor, the internal component may be the rotor, a bearing coupled to the rotor and so on. Further, based on the remaining useful life of the internal component, a remaining life of the motor 110 may be predicted. In addition, the diagnostics module may further generate suggestions for preventive maintenance actions to increase the remaining life of the motor 110.

The diagnostics module 185 further generates a notification indicating that the health condition of the motor 110 is abnormal, on the GUI 160. The notification may include a representative view of the abnormality. The representative view of the abnormality may include a real-time representation of the health condition of the internal component associated with the abnormality. For example, when the abnormality is angular misalignment of the rotor, a color-coded representation of a motion path of the misaligned rotor inside an airgap of the motor 110 and a resultant change in magnetic flux distribution inside the motor 110 may be shown. Further, the internal component corresponding to the abnormality, which is the rotor, may be highlighted in the color-coded representation. The notification may further include information associated with the impact of the abnormality in the motor 110 on the performance of the facility, the remaining useful life of the internal component and the remaining life of the motor 110. The representative view may further include a proposed schedule of the preventive maintenance activity and a corresponding downtime of the facility. Further, a human operator may interact with the GUI 160 to understand the nature of the abnormality and the preventive maintenance actions required. In another example, the notification may further include an audio alert.

In another embodiment, the controller 120 performs the functions of the apparatus 105. The first memory 135 of the controller 120 may include modules similar to the health monitoring module 190.

In yet another embodiment, the apparatus 105 may be in the form of a device that may be deployed on or near the motor 110. Further, the device may be communicatively coupled to a display device including a GUI (e.g., similar to GUI 160). The display device may be located at a remote location, thus enabling a human operator to monitor the health condition of the motor 110 remotely.

Figure 2:
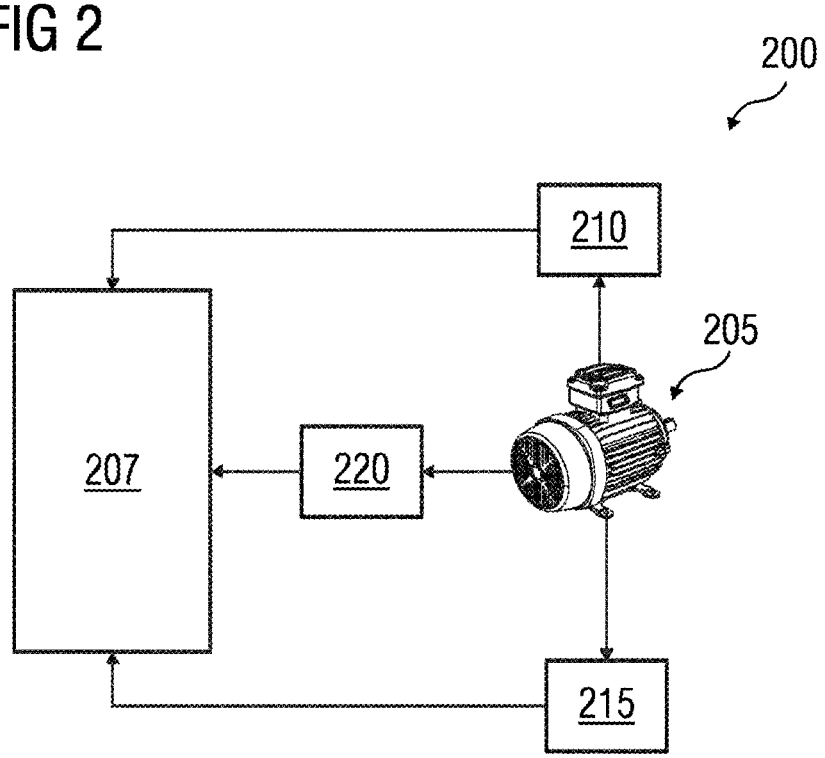
FIG. 2 illustrates a test setup for calibrating a virtual replica of the motor, in accordance with one exemplary embodiment.

Referring to FIG. 2, a test setup 200 for calibrating a virtual replica of a motor 205 to represent a real-time operation of the motor 205, is shown, in accordance with one exemplary embodiment. More specifically, the setup 200 is used to calibrate the virtual replica of the motor 205 to accurately represent the motor 205 along with abnormalities, if any, in real-time. The virtual replica resides on an apparatus 207 (similar to apparatus 105). In the present exemplary embodiment, the abnormality is associated with a rotor of the motor 205. The abnormality may include, but is not limited to, an unbalance of the rotor, a parallel misalignment of the rotor, an angular misalignment of the rotor, rotor displacement and a broken rotor bar.

The setup 200 includes a first sensing unit 210, a second sensing unit 215, and a third sensing unit 220 to measure operating parameters associated with the motor 205. The first sensing unit 210 includes radial vibration sensors and axial vibration sensors mounted on a housing of the motor 205 for measuring vibrations in the housing. The radial vibration sensors and/or the axial vibration sensors may be implemented using one of accelerometers, velocity meters, displacement meters, and non-contact sensors such as Eddy sensors. The second sensing unit 215 includes a non-contact sensor, (e.g., an Eddy sensor), for measurement of shaft vibrations. The non-contact sensor may be positioned directly above the shaft of the motor 205. The second sensing unit 215 may further include a displacement amplifier for amplifying the shaft vibrations. The third sensing unit 220 includes a flux probe mounted on the housing of the motor 205. The third sensing unit 220 further includes a Gauss meter communicatively and electrically coupled to the flux probe. The Gauss meter along with the flux probe is configured to measure the stray flux associated with the motor 205. In other words, the Gauss meter is configured to perform a flux leakage test on the motor 205. Additionally, the outputs of each of the first sensing unit 210, the second sensing unit 215 and the third sensing unit 220 may be further processed by respective signal conditioning units. The operational data from the first sensing unit 210, the second sensing unit 215 and the third sensing unit 220 are further sent to the apparatus 207. The apparatus 207 further simulates a behavior of the motor 205 using the operational data based on the virtual replica. The virtual replica includes metadata, historical data, and a model associated with the motor 205.

In one embodiment, the model is a three-dimensional magnetic flux model of the motor 205, (e.g., a finite-element (FE) model). The magnetic flux model may initially represent magnetic flux distribution in the motor 205, based on magnetization characteristics of different components such as rotor, stator, bearings, casing and so on, and contact conditions defined for each of the components. Further, the magnetic flux model may be used to simulate magnetic flux distribution in different regions within the motor 205 for different conditions of load and for different types of abnormalities. Further, the magnetic flux model is validated based on the stray magnetic flux measured by the third sensing unit 220. More specifically, the magnetic flux model is validated by comparing the measured value of stray magnetic flux density with the simulated value of stray magnetic flux density. Based on the result of validation, the magnetic flux model may be calibrated to a predefined accuracy with respect to stray magnetic flux. The stray magnetic flux is a parameter that may be measured externally using the third sensing unit 220. However, measurement of magnetic flux density at critical regions inside the motor 205, (e.g., at the rotor, stator coils, and so on), is difficult. Consequently, validation of simulated values of magnetic flux density at the critical regions is cumbersome. Therefore, the virtual replica may be calibrated with respect to the magnetic flux density at critical regions inside the motor 205 by applying, to the calibrated stray magnetic flux, a predefined correction factor corresponding to each of the critical regions. Similarly, other parameters associated with the magnetic flux model may also be calibrated. Further, the parameters may be continuously calibrated as described above, in order to replicate near real-time performance of the motor 205 using the virtual replica.

In another embodiment, the model may be a two-dimensional vibration model, for example, a Finite Element model. In one example, the two-dimensional vibration model may be based on a spring-mass-damper model of the motor 205. The spring-mass-damper model may include bearings modelled as springs with equivalent stiffness, fan covers modelled as lumped masses and so on. The two-dimensional vibration model may be used for simulating housing vibrations and shaft vibrations in the motor 205. Similar to the case of the magnetic flux model, the values of the simulated housing vibrations and the simulated shaft vibrations are validated by comparing with the values of housing vibrations received from the first sensing unit 210 and shaft vibrations received from the second sensing unit 215, respectively. Based on the validation, the two-dimensional vibration model may be calibrated to a predefined accuracy with respect to housing vibrations and shaft vibrations. In an embodiment, external vibration responses of the virtual replica (e.g., housing vibration response or vibration response associated with the housing) are calibrated using machine learning techniques. Further, internal vibration responses of the virtual replica may be calibrated based on the external vibration responses, by applying a correction factor. In one example, the internal vibration response may be the vibration response associated with the rotor (or rotor vibration response). The rotor vibration response thus calculated may be further used to simulate rotor displacement using the virtual replica. For example, the rotor displacement may be simulated based on a predefined criterion that the rotor displaces by 0.05 mm during vibrations.

Figure 3:
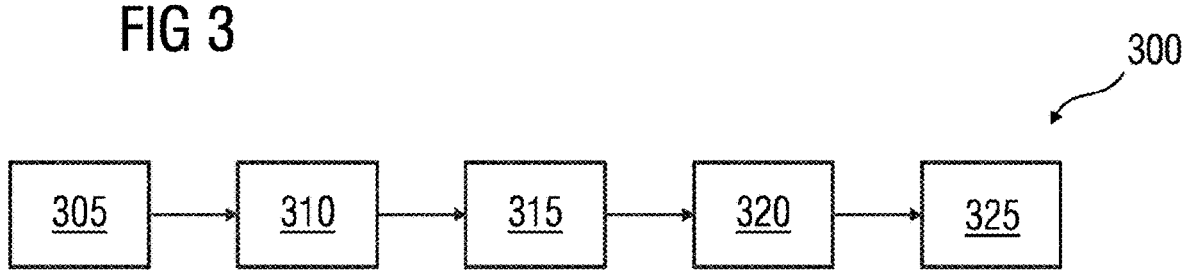
FIG. 3 illustrates a flowchart of a method for determining correlation of rotor displacement in the motor with housing vibration response of the motor, in accordance with one exemplary embodiment.
Figure 4:
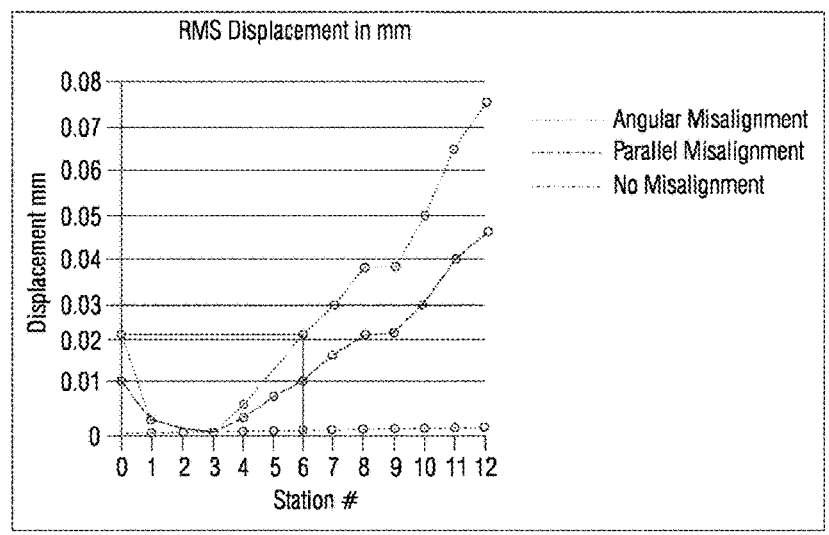
FIG. 4 depicts an example of a graph of simulated rotor displacement for angular misalignment, parallel misalignment, and no misalignment.
Figure 5:
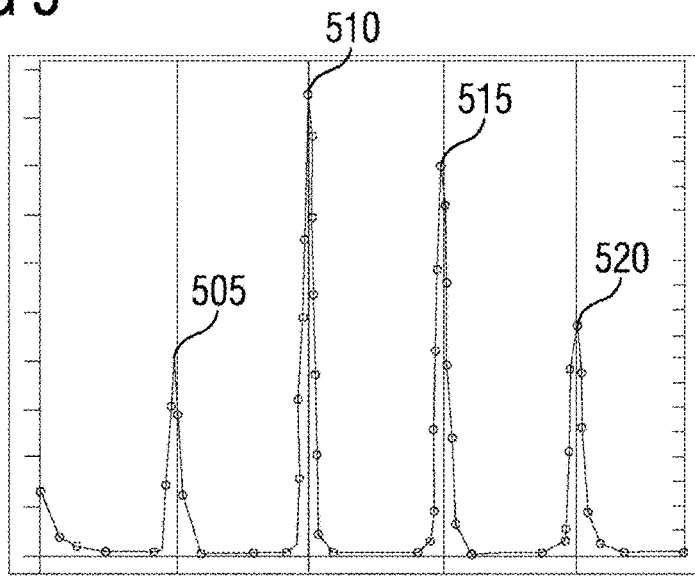
FIG. 5 depicts examples of housing vibration responses of the motor, obtained from operational data, for parallel misalignment.
Figure 6:
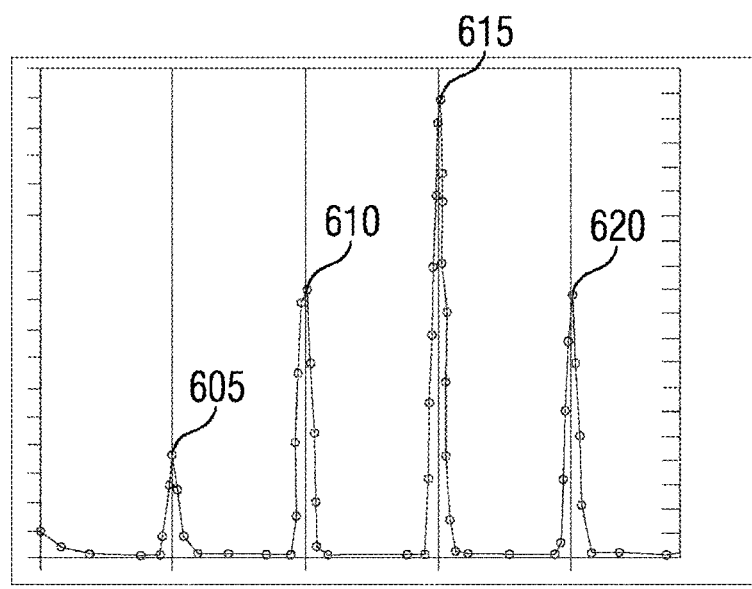
FIG. 6 depicts examples of housing vibration responses of the motor, obtained from operational data, for angular misalignment.

Referring to FIG. 3, in conjunction with FIG. 2 and FIGS. 4, 5, and 6, a flowchart of a method 300 for determining correlation of rotor displacement with the housing vibration response, is shown, in accordance with one embodiment. FIG. 4 illustrates simulated rotor displacement (in millimeters) with respect to a plurality of stations 1, 2, . . . 13 on the rotor for angular misalignment of the rotor, parallel misalignment of the rotor and no misalignment of the rotor. Further, FIGS. 5 and 6 show actual housing vibration responses of the motor 205 for parallel misalignment and angular misalignment respectively. The method 300 includes acts 305-325.

At act 305, rotor displacement is determined based on simulations using the calibrated virtual replica. The stations 1, 2, . . . 13 represent equally distributed measurement points along the length of the rotor, wherein station 7 represents a central measurement point on the rotor. More specifically, the simulated results of FIG. 4 show the root-mean-square values of rotor displacement at each of the stations for angular misalignment, parallel misalignment, and no misalignment.

At act 310, the housing vibration response is obtained based on the measured values of housing vibrations from the first sensing unit 210. For the present example, the housing vibration responses from test results, for parallel misalignment and angular misalignment are shown in FIG. 5 and FIG. 6 respectively. The housing vibration responses are obtained by applying a Fast Fourier Transform (FFT) to the measured values of housing vibration at a sampling frequency SF. The minimum frequency $\Delta f$ of the FFT may be given by:

$$\Delta f = SF/N = 1/(N \cdot \Delta t)$$

where, N is the number of FFT points and $\Delta t$ is the minimum time step. The minimum time step $\Delta t$ is the inverse of the minimum frequency $\Delta f$. While sampling the values of vibration, the minimum frequency $\Delta f$ is set such that the line frequency does not merge with the minimum frequency at any point. Based on results of the FFT, a first harmonic 505, a second harmonic 510, a third harmonic 515, and a fourth harmonic 520 of the housing vibration response for parallel misalignment of the rotor are determined, as shown in FIG. 5. Similarly, a first harmonic 605, a second harmonic 610, a third harmonic 615, and a fourth harmonic 620 of the housing vibration response for angular misalignment of the rotor are also determined based on results of the FFT, as shown in FIG. 6.

Referring to FIGS. 4 and 5, for parallel misalignment, the simulated rotor displacement at station 7 is 0.013 mm and the corresponding test results show that the peak of the fourth harmonic 520 has an amplitude of 0.05 m/s². Similarly, referring to FIGS. 4 and 6, for angular misalignment, the simulated rotor displacement at station 7 is 0.023 mm and the corresponding test results show that the peak of the fourth harmonic 620 has an amplitude of 0.1 m/s². In other words, when the rotor displacement increases by a factor of 2, the amplitude of the fourth harmonic 620 also increases by a factor of two. Therefore, there exists a strong correlation between the simulated rotor displacement and the amplitude of the peak of the fourth harmonic 620 (or 520) of the housing vibration response. The correlation is a direct consequence of rotor displacement and resulting airgap asymmetry contributing to the housing vibrations. The correlation between the simulated rotor displacement and the peak of the fourth harmonic 620 (or 520) is established using a correlation analysis technique at act 315. As the rotor displacement causes a change in the airgap flux density, it is also possible to identify correlations between the airgap flux density and the fourth harmonic 620 (520). In another implementation, a correlation between the simulated rotor displacement and the measured airgap flux density may also be determined.

At act 320, a correlation model is generated for the correlations established in act 315, to determine rotor displacement based on the peak of the fourth harmonic 620 (or 520) of the housing vibration response obtained from the motor 205 in real-time. Similarly, correlation models may be generated to determine abnormalities indicated by other harmonics of the housing vibration response. For example, the peak of the first harmonic 505 (or 605) may be correlated with unbalances in the rotor, the peak of the third harmonic 515 (or 615) may be correlated with misalignments in the rotor and so on.

As may be understood, the airgap asymmetry resulting from rotor displacement causes magnetic flux variations in the motor 205. The virtual replica may also determine magnetic flux variations at critical locations inside the motor 205 based on the rotor displacements, as indicated by act 325. In one example, correlation models may be generated, as explained above, for mapping housing vibration response to the magnetic flux density at the critical locations inside the motor 205.

Figure 7:
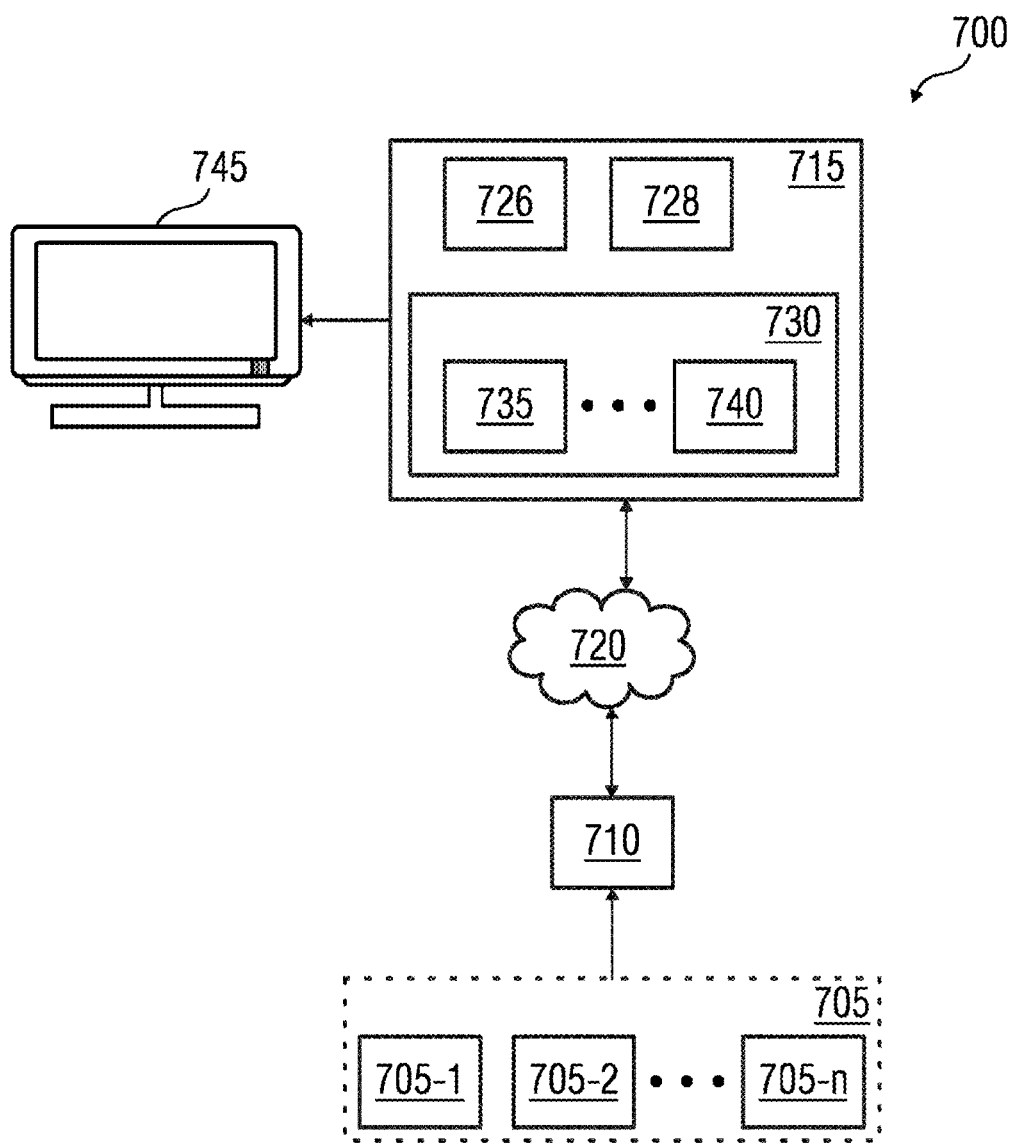
FIG. 7 illustrates a system for managing health condition of a fleet of motors, in accordance with one embodiment.

Referring to FIG. 7, a system 700 for managing health condition of a fleet of motors 705-1, 705-2, . . . 705-n (collectively referred as fleet 705) is illustrated, in accordance with one embodiment. The system 700 includes an apparatus 710 (similar to apparatus 105).

The apparatus 710 is communicatively coupled to one or more sensing units (not shown) associated with each of the motors in the fleet 705. Each of the one or more sensing units measure values associated with an operating parameter of each of the motors in the fleet 705. The apparatus 710 is further communicatively coupled to a server 715 over a network interface 720. The server 715 is further communicatively coupled to a display device 745 including a GUI.

The server 715 includes a communication unit 726, one or more processing units 728, and a memory 730. The memory 730 is configured to store computer program instructions defined by modules, for example, health monitoring module 735 (similar to health monitoring module 190). Further, the memory 730 may also store at least one virtual replica corresponding to at least one motor in the fleet 705.

In an embodiment, the server 715 may also be implemented on a cloud computing environment, where computing resources are delivered as a service over the network interface 720. As used herein, "cloud computing environment" refers to a processing environment including configurable computing physical and logical resources, for example, networks, servers, storage, applications, services, etc., and data distributed over the network interface 720, for example, the internet. The cloud computing environment provides on-demand network access to a shared pool of the configurable computing physical and logical resources. The network interface 720 is, for example, a wired network, a wireless network, a communication network, or a network formed from any combination of these networks.

In the present embodiment, the apparatus 710 acts as an edge device for collecting operational data associated with each of the motors in the fleet 705. The correlations between operational data and abnormalities in the health condition for each of the motors in the fleet 705 may vary. The variations in the correlations may be due to degradation of performance, changes in operating environment associated with each of the motors, defect tolerances of each of the motors, load profile of each of the motors, and so on. In one example, each motor in the fleet 705 may be associated with a variability factor. The variability factor may account for variations associated with the motor.

The memory 730 may further include a fleet calibration module 735 for calibrating a virtual replica corresponding to the fleet 705. The virtual replica may be calibrated, using Artificial Intelligence (AI) based techniques. For example, the AI based technique may use a deep learning-based AI model to dynamically calibrate the virtual replica for each of the motors, based on operational data received in real-time and the variability factors, if any. The AI model may be trained, based on historic data associated with each of the motors, to calibrate the virtual replica. The health monitoring module 740 further determines one or more abnormalities in each of the motors in the fleet 705, based on the calibrated virtual replicas. Further, a representative view of the one or more abnormalities is rendered on the GUI of the display device 745. For example, the representative view may indicate, using color-coding, rotor displacements in one or more motors in the fleet 705 and magnetic flux variations in the one or more motors resulting from the rotor displacement. The representative view may include two-dimensional representations of the abnormalities. In another example, the representative view may include three-dimensional representations. Further, the abnormalities in the health condition of the motor, say motor 705-1, may be further used to determine a remaining useful life associated with an internal component corresponding to the abnormality in the motor 705-1, a remaining life of the motor 705-1, an impact of the abnormality on the performance of a facility wherein the fleet 705 is a part of the facility, and so on. The health monitoring module 740 may also determine an impact of the abnormality in the motor 705-1 on other motors in the fleet 705. Further, the health monitoring module 740 may also schedule preventive maintenance actions for the fleet 705 based on the abnormalities detected in each of the motors in the fleet 705. The health monitoring module 740 may further determine an optimized downtime for the facility based on the preventive maintenance activities scheduled.

Referring to FIG. 8, a flowchart of a method 800 for managing health condition of a motor is shown, in accordance with one embodiment. In one example, the method 800 may be implemented on the apparatus 105. The method includes acts 805-830.

At act 805, operational data associated with the motor 110 is received in real-time from one or more sensing units 115. The operational data includes parameter values corresponding to an operation of the motor 110.

At act 810, a virtual replica of the motor is configured, by the simulation module 180, using the operational data.

At act 815, simulation results are generated, by the simulation module 180, by simulating a behavior of the motor 110 on at least one simulation instance of the motor based on the configured virtual replica of the motor. The simulation results are indicative of the behavior of the rotating system.

At act 820, an abnormality in the health condition of the motor is determined, by the diagnostics module 185, based on analysis of the simulation results. The abnormality in the health condition corresponds to a health status of at least one internal component of the motor 110.

At act 825, a notification is generated, by the diagnostics module 185, to indicate that the health condition of the motor is abnormal on the GUI 160.

The present disclosure may take the form of a computer program product including program modules accessible from computer-usable or computer-readable medium storing program code for use by or in connection with one or more computers, processors, or instruction execution system. For the purpose of this description, a computer-usable or computer-readable medium is any apparatus that may contain, store, communicate, propagate, or transport the program for use by or in connection with the instruction execution system, apparatus, or device. The medium may be electronic, magnetic, optical, electromagnetic, infrared, or semi-conductor system (or apparatus or device) or a propagation mediums in and of themselves as signal carriers are not included in the definition of physical computer-readable medium include a semiconductor or solid state memory, magnetic tape, a removable computer diskette, random access memory (RAM), a read only memory (ROM), a rigid magnetic disk and optical disk such as compact disk read-only memory (CD-ROM), compact disk read/write, and DVD. Both processors and program code for implementing each aspect of the technology may be centralized or distributed (or a combination thereof) as known to those skilled in the art.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A computer-implemented method of managing health condition of a rotating system, the method comprising:
receiving, by a processing unit, operational data associated with the rotating system in real-time from one or more sensing units, wherein the operational data comprises parameter values corresponding to an operation of the rotating system;

configuring a virtual replica of the rotating system using the operational data;
generating simulation results by simulating behavior of the rotating system on at least one simulation instance of the rotating system based on the configured virtual replica of the rotating system, wherein the simulation results are indicative of the behavior of the rotating system;
determining an abnormality in a health condition of the rotating system based on an analysis of the simulation results; and
generating a notification indicating that the health condition of the rotating system is abnormal,
wherein the simulation results are analyzed to determine a deviation in the behavior of the rotating system with respect to an expected behavior of the rotating system,
wherein at least one correlation model is identified among a plurality of correlation models based on the determined deviation in the behavior of the rotating system,
wherein the abnormality is determined in real-time using the identified at least one correlation model and one or more parameter values corresponding to the deviation in the behavior of the rotating system, and
wherein the abnormality corresponds to a health status of at least one internal component of the rotating system.

2. The method of claim 1, wherein the virtual replica is a virtual representation of the rotating system.

3. The method of claim 2, wherein the configuring of the virtual replica comprises updating the virtual replica of the rotating system based on the operational data, using the simulation instance, in real-time.

4. The method of claim 3, wherein the generating of the notification comprises rendering a representative view of the abnormality on a Graphical User Interface,
wherein the representative view of the abnormality comprises a real-time representation of the health condition of the internal component associated with the abnormality.

5. The method of claim 4, wherein the real-time representation of the internal component associated with the abnormality is a color-coded representation of the internal component in conjunction with the abnormality in the health condition of the rotating system.

6. The method of claim 1, wherein the configuring of the virtual replica comprises updating the virtual replica of the rotating system based on the operational data, using the simulation instance, in real-time.

7. The method of claim 1, wherein the generating of the notification comprises rendering a representative view of the abnormality on a Graphical User Interface,
wherein the representative view of the abnormality comprises a real-time representation of the health condition of the internal component associated with the abnormality.

8. The method of claim 7, wherein the real-time representation of the internal component associated with the abnormality is a color-coded representation of the internal component in conjunction with the abnormality in the health condition of the rotating system.

9. The method of claim 1, wherein the abnormality comprises an airgap asymmetry, a rotor vibration, a rotor displacement, a magnetic field asymmetry, an eccentricity of the airgap, an unbalanced force, a heating problem, a bearing defect, a rotor bar breakage, or a stator problem.

10. The method of claim 9, wherein the at least one internal component of the rotating system comprises a rotor, a stator, a bearing, a stator coil, a brush, or a combination thereof.

11. The method of claim 1, wherein the at least one internal component of the rotating system comprises a rotor, a stator, a bearing, a stator coil, a brush, or a combination thereof.

12. An apparatus for managing health condition of a rotating system, the apparatus comprising:
one or more processors; and
a memory communicatively coupled to the one or more processors,
wherein the memory, with the one or more processors, is configured to:
receive operational data associated with the rotating system in real-time from one or more sensing units, wherein the operational data comprises parameter values corresponding to an operation of the rotating system;
configure a virtual replica of the rotating system using the operational data;
generate simulation results by simulating behavior of the rotating system on at least one simulation instance of the rotating system based on the configured virtual replica of the rotating system, wherein the simulation results are indicative of the behavior of the rotating system;
determine an abnormality in a health condition of the rotating system based on an analysis of the simulation results; and
generate a notification indicating that the health condition of the rotating system is abnormal,
wherein the simulation results are analyzed to determine a deviation in the behavior of the rotating system with respect to an expected behavior of the rotating system,
wherein at least one correlation model is identified among a plurality of correlation models based on the determined deviation in the behavior of the rotating system,
wherein the abnormality is determined in real-time using the identified at least one correlation model and one or more parameter values corresponding to the deviation in the behavior of the rotating system, and
wherein the abnormality corresponds to a health status of at least one internal component of the rotating system.

13. A system comprising:
one or more sensing units configured to provide operational data associated with a rotating system; and
an apparatus communicatively coupled to the one or more sensing units, wherein the apparatus is configured to manage health condition of the rotating system,
wherein the apparatus comprises one or more processors and a memory communicatively coupled to the one or more processors, and wherein the memory, with the one or more processors, is configured to:
receive the operational data associated with the rotating system in real-time from the one or more sensing units, wherein the operational data comprises parameter values corresponding to an operation of the rotating system;
configure a virtual replica of the rotating system using the operational data;

generate simulation results by simulating behavior of the rotating system on at least one simulation instance of the rotating system based on the configured virtual replica of the rotating system, wherein the simulation results are indicative of the behavior of the rotating system;

determine an abnormality in a health condition of the rotating system based on an analysis of the simulation results; and generate a notification indicating that the health condition of the rotating system is abnormal, wherein the simulation results are analyzed to determine a deviation in the behavior of the rotating system with respect to an expected behavior of the rotating system, wherein at least one correlation model is identified among a plurality of correlation models based on the determined deviation in the behavior of the rotating system, wherein the abnormality is determined in real-time using the identified at least one correlation model and one or more parameter values corresponding to the deviation in the behavior of the rotating system, and wherein the abnormality corresponds to a health status of at least one internal component of the rotating system.

* * * * *